United States Patent
Mann et al.

(10) Patent No.: US 9,456,526 B2
(45) Date of Patent: Sep. 27, 2016

(54) RACK FOR ACCOMMODATING ELECTRONIC PLUG-IN BOARDS

(71) Applicant: Schroff GmbH, Straubenhardt (DE)

(72) Inventors: Dietmar Mann, Remchingen (DE); Oliver Kistner, Pforzheim (DE)

(73) Assignee: Pentair Technical Solutions GmbH, Straubenhardt (DE)

( * ) Notice: Subject to any disclaimer, the term of this patent is extended or adjusted under 35 U.S.C. 154(b) by 195 days.

(21) Appl. No.: 14/249,690

(22) Filed: Apr. 10, 2014

(65) Prior Publication Data

US 2014/0307375 A1 Oct. 16, 2014

(30) Foreign Application Priority Data

Apr. 12, 2013 (EP) .................................... 13163468

(51) Int. Cl.
*H05K 7/20* (2006.01)
*G06F 1/20* (2006.01)
*H05K 7/14* (2006.01)

(52) U.S. Cl.
CPC ............. *H05K 7/20172* (2013.01); *G06F 1/20* (2013.01); *H05K 7/1445* (2013.01); *H05K 7/1457* (2013.01); *H05K 7/20563* (2013.01)

(58) Field of Classification Search
CPC .... G06F 1/20; H05K 7/1445; H05K 7/1457; H05K 7/20172; H05K 7/20563
USPC ........... 361/679.49, 633, 636–640, 648–650, 361/775, 788; 165/80.3, 104.33; 174/15.1, 174/16.1; 711/114; 454/184
See application file for complete search history.

(56) References Cited

U.S. PATENT DOCUMENTS

| | | | |
|---|---|---|---|
| 6,198,633 B1 * | 3/2001 | Lehman ................... | G06F 1/18 312/332.1 |
| 7,154,748 B2 * | 12/2006 | Yamada ............. | H05K 7/20572 361/690 |
| 7,256,992 B1 | 8/2007 | Stewart et al. | |
| 7,722,359 B1 * | 5/2010 | Frangioso, Jr. ..... | H05K 7/20563 361/679.48 |
| 8,064,200 B1 * | 11/2011 | West ................... | H05K 7/20563 361/694 |
| 8,144,458 B2 * | 3/2012 | Vinson ................. | G11B 33/124 165/80.2 |
| 8,164,900 B2 * | 4/2012 | Sun ........................ | G06F 1/188 361/694 |
| 8,208,253 B1 | 6/2012 | Goergen et al. | |
| 8,238,094 B1 * | 8/2012 | Aybay .................. | H05K 7/1445 312/236 |

(Continued)

OTHER PUBLICATIONS

Eike Waltz, AdvancedTCA Extensions PICMG 3.7 Mechanical, Proceedings, ATCA Summit 2012, Sep. 18, 2012.

*Primary Examiner* — Courtney Smith
*Assistant Examiner* — Zhengfu Feng
(74) *Attorney, Agent, or Firm* — Bose McKinney & Evans LLP

(57) ABSTRACT

A rack for electronic plug-in boards has board cages on the front and rear sides and at least one vertical backplane arranged between the board cages. The rack has an installation space provided underneath or above the board cages and into which fan modules can be horizontally inserted from the front side. A power supply module with an electronics unit supplies power to the backplane. The installation space continuously extends up to the region of the board cage on the rear side. The electronics unit is arranged in the region of the rear side of the rack underneath or above the board cage and defines the installation space toward the rear. The electronics unit is connected to the backplane by rigid electric conductors horizontally extending between the board cage on the rear side and the installation space parallel and at a distance from one another.

12 Claims, 2 Drawing Sheets

(56) References Cited

U.S. PATENT DOCUMENTS

| | | | |
|---|---|---|---|
| 8,325,479 B2* | 12/2012 | Siracki | H05K 7/20918 361/678 |
| 2004/0062002 A1* | 4/2004 | Barringer | G06F 1/18 361/679.4 |
| 2005/0024825 A1* | 2/2005 | Smith | G06F 1/181 361/679.46 |
| 2005/0128704 A1 | 6/2005 | Patel | |
| 2005/0207134 A1* | 9/2005 | Belady | H05K 1/14 361/796 |
| 2014/0036444 A1* | 2/2014 | Nishio | H05K 7/20563 361/695 |

* cited by examiner

RACK FOR ACCOMMODATING ELECTRONIC PLUG-IN BOARDS

RELATED APPLICATIONS

This application claims priority to EP 13 163 468.5, filed Apr. 12, 2013, which is hereby incorporated herein by reference in its entirety.

BACKGROUND

The present invention pertains to a rack for accommodating electronic plug-in boards with a board cage on the front side, a board cage on the rear side, at least one vertical backplane that is arranged between the board cage on the front side and the board cage on the rear side, an installation space that is provided underneath the board cage on the front side and into which at least one fan module can be horizontally inserted from the front side, and a power supply module with an electronics unit that supplies the backplane with power.

Such a rack is used, for example, in modular computer systems for the telecommunication industry. In this case, the board cage on the rear side is significantly shorter than the board cage on the front side. The individual plug-in boards are plugged into the backplane arranged between the two board cages. The rack encloses the board cage on the front side and the board cage on the rear side, as well as the installation space for fans located underneath.

Due to the different sizes of the board cages, the board cage on the rear side can only accommodate significantly shorter plug-in boards than the board cage on the front side. Accordingly, the power demand of the smaller plug-in boards is also lower than the power demand of the larger plug-in boards.

The power supply of the backplanes and the plug-in boards connected thereto is realized with a special power supply module. This power supply module is connected to the main backplane and usually located underneath the board cage on the rear side. It frequently occupies the entire space underneath the board cage on the rear side or at least a large portion of this space.

Electric fans are arranged underneath or above the board cage on the front side in order to cool the plug-in boards during the operation. These fans generate an air current that flows around the plug-in boards on the front side. Openings are frequently provided in the backplane in order to also cool the plug-in boards in the board cage on the rear side. The cooling air flows through these openings and into the rear board cage past the power supply module. The air current that reaches the plug-in boards in the board cage on the rear side therefore is significantly weaker than in the cage on the front side.

New standards on modular computer systems such as, for example, AdvancedTCA Extensions define a modular construction system with a rack, the board cage of which on the rear side has the same size as its board cage on the front side. The plug-in boards that were only installed in the board cage on the front side until now should also be used with identical size in the board cage on the rear side. This increases the power demand of the plug-in boards on the rear side as high as 500 Watt. The cooling demand of the rear plug-in boards increases accordingly. The required cooling of the board cage on the rear side can no longer be ensured with the existing cooling concept.

SUMMARY

The present invention provides an improved rack that meets the requirements of the new standard and makes it possible to sufficiently cool the plug-in boards of both board cages.

According to this disclosure, the installation space for the fan module continuously extends up to the region of the board cage on the rear side, wherein the installation space may be selectively arranged underneath or above the board cages. In this way, it is possible to insert the fan module into the rack on the front side in such a manner that it respectively extends underneath or above the board cage on the front side, as well as underneath or above the board cage on the rear side. The electric fans of the fan module may either take in air from the surroundings and convey ("push") this air through the board cages or draw ("pull") heated exhaust air from the board cages.

The electronics unit of the power supply module is arranged underneath or above the board cage on the rear side in the region of the rear side of the rack and defines the installation space toward the rear. The electronics unit is preferably inserted into the rack from the rear side and also only accessible from the rear side of the rack. The electronics unit therefore can be conventionally supplied with line voltage. In case of a defect, the electronics unit can be easily and quickly exchanged.

The electronics unit is connected to the backplane by a number of rigid electric conductors, wherein the conductors horizontally extend between the board cage on the rear side and the installation space for the fan module parallel and at a distance from one another. The fan module that generates a cooling air current for cooling the plug-in boards in the board cage on the rear side is also positioned in the installation space. The cooling air flows to the plug-in boards in the board cage on the rear side through clearances between the electric conductors. The parallel and spaced-apart electric conductors of the power supply module only generate a very small flow resistance. The cooling air therefore is able to flow into the board cage on the rear side or, when using an intake fan, out of the board cage and into the installation space in a nearly unobstructed fashion.

The electric conductors preferably comprise a number of busbars that respectively have a rectangular cross section. The backplane can be supplied with very high electric currents with the aid of such busbars. The rectangular cross section of the busbars respectively has two opposing long sides and two short sides. The flow resistance of the busbars is minimized due to the fact that the long sides of the cross section essentially extend vertically. The electric conductors may also comprise other conductors such as, for example, signal conductors. The signal conductors are preferably realized in the form of thin printed boards or flat conductors that are also aligned vertically in order to obstruct the cooling air current as little as possible.

According to another optional feature of this disclosure, the long sides of the busbars may form air baffles for cooling air. Consequently, the cooling air flowing past the busbars can be purposefully guided with the aid of the air baffles. In this way, air turbulences can be reduced such that a uniform cooling air current flows past the plug-in boards. This once again improves the cooling of the plug-in boards.

It is advantageous to provide the power supply module with an L-shaped cross section, wherein the electronics unit forms the short L-limb and the busbars form the long L-limb. Due to the L-shaped cross section, the compact electronics unit can be arranged on the rear side of the rack while the narrow busbars horizontally extend between the board cage on the rear side and the installation space for the fan module. The busbars bridge the distance between the electronics unit and the backplane.

The busbars are preferably surrounded by a rectangular U-shaped chassis, wherein the U-limbs extend parallel to the busbars and the U-crosspiece extends transverse thereto and parallel to the backplane. For example, the U-shaped chassis comprises two U-limbs that are arranged parallel to one another and connected to one another by means of a U-crosspiece. The U-crosspiece extends transverse to the two U-limbs. The busbars are mechanically stabilized with the aid of the U-shaped chassis. For example, the U-shaped chassis is connected to the electronics unit and the busbars are fixed on the U-shaped chassis. The U-shaped chassis, the current conductors and the electronics unit form a stable, torsion-resistant unit. A force that might act upon the power supply module is primarily absorbed by the U-shaped chassis such that the busbars are protected from damaging force effects. In this way, damages to the busbars are prevented, in particular, during the insertion of the power supply module into the rack.

It is advantageous if the section of the chassis that forms the U-crosspiece carries plug-type connectors for producing the connection with the backplane. These plug-type connectors are preferably arranged in the inserting direction of the power supply module, along which the power supply module is inserted into the rack. In this way, the power supply module can be easily connected to the backplane. To this end, the power supply module is inserted into the rack in the direction of the backplane from the rear side of the rack, wherein the plug-type connectors are pushed on corresponding counterparts on the backplane.

The installation space advantageously has two installation levels that lie vertically on top of one another, wherein the first installation level can accommodate a first fan module that extends up to the region of the board cage on the rear side and the second installation level can accommodate a second fan module that only extends up to the end of the board cage on the front side. The shorter second installation level directly borders on the board cage on the front side.

Fans that especially cool the plug-in boards in the board cage on the rear side are preferably arranged on the first installation level. Other fans that primarily supply the plug-in boards in the board cage on the front side with cooling air may be arranged on the second installation level. Consequently, sufficient and uniform cooling of both board cages can be ensured. Furthermore, the cooling of the two board cages may take place independently of one another. The fan modules for the first and the second installation level may be realized separately or in the form of a combined assembly that can be inserted into the installation space on the front side. It goes without saying that the installation space is advantageously equipped with lateral guides for sliding in the fan modules.

According to another optional feature of this disclosure, the backplane may protrude into the installation space by a certain distance with one end and thusly define the adjacent second installation level toward the rear. For example, a stop for the fan module may be realized on the second installation level with the aid of the protruding section. It would also be conceivable to provide the power terminals, by means of which the fan modules are supplied with power, on the section of the backplane that protrudes into the installation space.

In an exemplary embodiment, the backplane carries on its rear side special plug-type connectors for connecting the power supply module in the region of its end that protrudes into the installation space. In this case, the electric conductors of the power supply module can respectively extend underneath or above the board cage on the rear side at the height of the second installation level of the installation space. If the backplane thusly protrudes into the installation space by a certain distance with the plug-type connectors, the power supply module can be easily connected to the backplane by being horizontally inserted into the rack. In this case, the plug-type connectors on the backplane are arranged such that they correspond to the plug-type connectors on the U-shape chassis of the power supply module referred to the inserting direction of the power supply module.

Another aspect of this disclosure concerns a special power supply module for installation into an inventive rack, wherein said power supply module comprises an electronics unit for generating the supply voltages for the backplane and electric conductors that connect the electronics unit to the backplane. According to this disclosure, the electric conductors comprise busbars that have a rectangular cross section with respectively opposing long sides and short sides. The busbars are essentially arranged parallel to one another and spaced apart from one another along the long sides. The long sides of the busbars form air baffles. The parallel and spaced-apart arrangement of the busbars results in the largest possible clearances, through which cooling air can flow freely. The busbars with their rectangular cross sections particularly generate very little air resistance. Furthermore, the air flowing through the clearances can be purposefully guided with the aid of the air baffles such that turbulences in passing air currents can be reduced.

The power supply module is preferably realized with an L-shaped cross section, wherein the electronics unit forms the short L-limb and the busbars form the long L-limb. The L-shaped cross section makes it possible to arrange the electronics unit on the rear side of the inventive rack while the busbars extend in the direction of the backplane that is centrally arranged in the rack and connect the electronics unit to the backplane.

According to another optional feature of this disclosure, the busbars may be surrounded by a U-shaped chassis, wherein the U-limbs extend parallel to the busbars and the U-crosspiece is arranged transverse thereto. The U-shaped chassis is connected to the electronics unit; it reinforces the region of the power supply module, in which the busbars are located. The U-shaped chassis makes it possible to transmit mechanical loads and therefore to prevent damaging forces from acting upon the busbars. For example, the U-limbs are directly connected to the electronics unit. The U-crosspiece is located on the side of the U-shaped chassis that points away from the electronics unit.

It is advantageous if the section of the chassis that forms the U-crosspiece carries plug-type connectors for producing the electrical connection with a backplane. The power supply module can be easily connected to the corresponding backplane with the aid of these plug-type connectors. The plug-type connectors are preferably arranged along the longitudinal direction of the long L-limb, i.e., in the inserting direction of the power supply module into the rack.

BRIEF DESCRIPTION OF THE DRAWINGS

The above-mentioned aspects of exemplary embodiments will become more apparent and will be better understood by reference to the following description of the embodiments taken in conjunction with the accompanying drawings, wherein.

DETAILED DESCRIPTION

The embodiments described below are not intended to be exhaustive or to limit the invention to the precise forms disclosed in the following detailed description. Rather, the embodiments are chosen and described so that others skilled in the art may appreciate and understand the principles and practices of the present invention.

In this disclosure, terms such as "vertical," "parallel," "transverse," "horizontal" and the like are used to describe the orientation or position of structural elements disclosed herein. As would be readily recognized by one of ordinary skill, it shall be understood for purposes of this disclosure that these terms are not used to connote exact mathematical orientations, but are instead used as terms of approximation. For example, as used herein the term "vertical" certainly includes a structure that is positioned exactly 90 degrees from horizontal, but it also encompasses structure that may deviate one way or the other from 90 degrees. As would be readily understood by one of skill in the art, the term "vertical" should be understood as generally meaning positioned up and down rather than side to side, and vice versa for the term "horizontal." Other terms used herein to connote orientation should be similarly interpreted.

Figure 1:
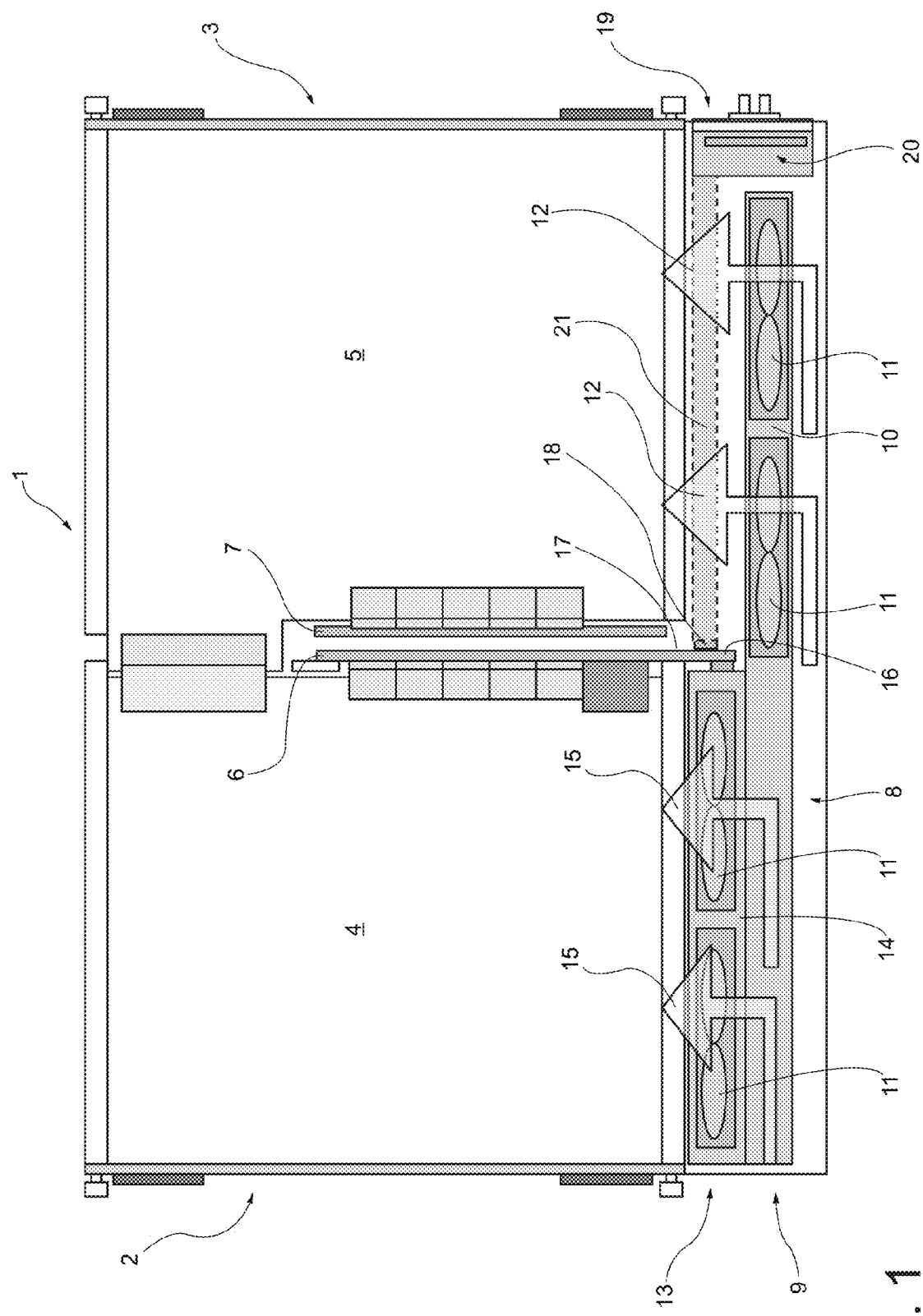
FIG. 1 shows a rack with a power supply module in the form of a simplified vertical section.

FIG. 1 shows a rack 1 that has a front side 2 and a rear side 3 and serves for accommodating electronic plug-in boards. The rack 1 comprises a board cage 4 on the front side and a board cage 5 on the rear side. A first backplane 6, as well as a second backplane 7 for the rear board cage 5 that extends parallel to the first backplane, are vertically arranged between the board cage 4 on the front side and the board cage 5 on the rear side.

An installation space 8 is arranged underneath the two board cages 4, 5. The installation space 8 continuously extends from the front side 2 of the rack 1 up to the region of the board cage 5 on the rear side.

The installation space 8 has a first lower installation level 9, on which a first fan module 10 is positioned. The first fan module 10 extends up to the region of the board cage 5 on the rear side in the horizontal direction. It comprises fans 11 that take in air in the region of the front side 2 of the rack 1 and convey this air in the direction of the board cage 5 on the rear side along the directional arrows 12.

The installation space 8 furthermore comprises a second upper installation level 13, on which a second fan module 14 is arranged. The second fan module 14 is shorter and only extends up to the end of the board cage 4 on the front side; it comprises fans 11. Air is taken in from the front side 2 of the rack 1 and conveyed in the direction of the board cage 4 on the front side along the directional arrows 15 with the aid of the fans 11 of the second fan module 14.

The fans of the fan module 10 may just as well take in air that flows in the opposite direction, namely from the plug-in boards on the rear side to the fan module 10. In this case, the heated cooling air flows from the board cages 4, 5 into a (not-shown) exhaust air space arranged above the board cages 4, 5. A combination of pulling and pushing fans would also be conceivable.

The first fan module 10 and the second fan module 14 may be a single assembly that is inserted into the rack 1 on the front side. The installation space 8 is provided with lateral guides, on which the fan modules 10, 14 slide.

The first backplane 6 protrudes into the installation space 8 by a certain distance with its lower end 16. In this way, the first backplane 6 defines the upper installation level 13 in the direction of the rear side 3 of the rack 1. The lower end 16 of the first backplane 6 is mechanically and electrically connected to the second fan module 14. In this way, the fan module 14, as well as the fan module 10, is supplied with power.

On its rear side 17, the backplane 6 is provided with special plug-type connectors 18 in the region of the lower end 16. The backplane 6 is connected to a power supply module 19 that supplies both backplanes 6, 7 with power by means of these plug-type connectors 18.

The power supply module 19 comprises a compact electronics unit 20 that is arranged in the region of the rear side 3 of the rack 1 underneath the board cage 5 on the rear side. The electronics unit 20 defines the installation space 8 toward the rear, i.e., in the direction of the rear side 3 of the rack 1.

The electronics unit 20 is connected to the backplane 6 by a number of rigid electric conductors 21. The electric conductors 21 extend horizontally between the board cage 5 on the rear side and the first fan module 10.

Figure 2:
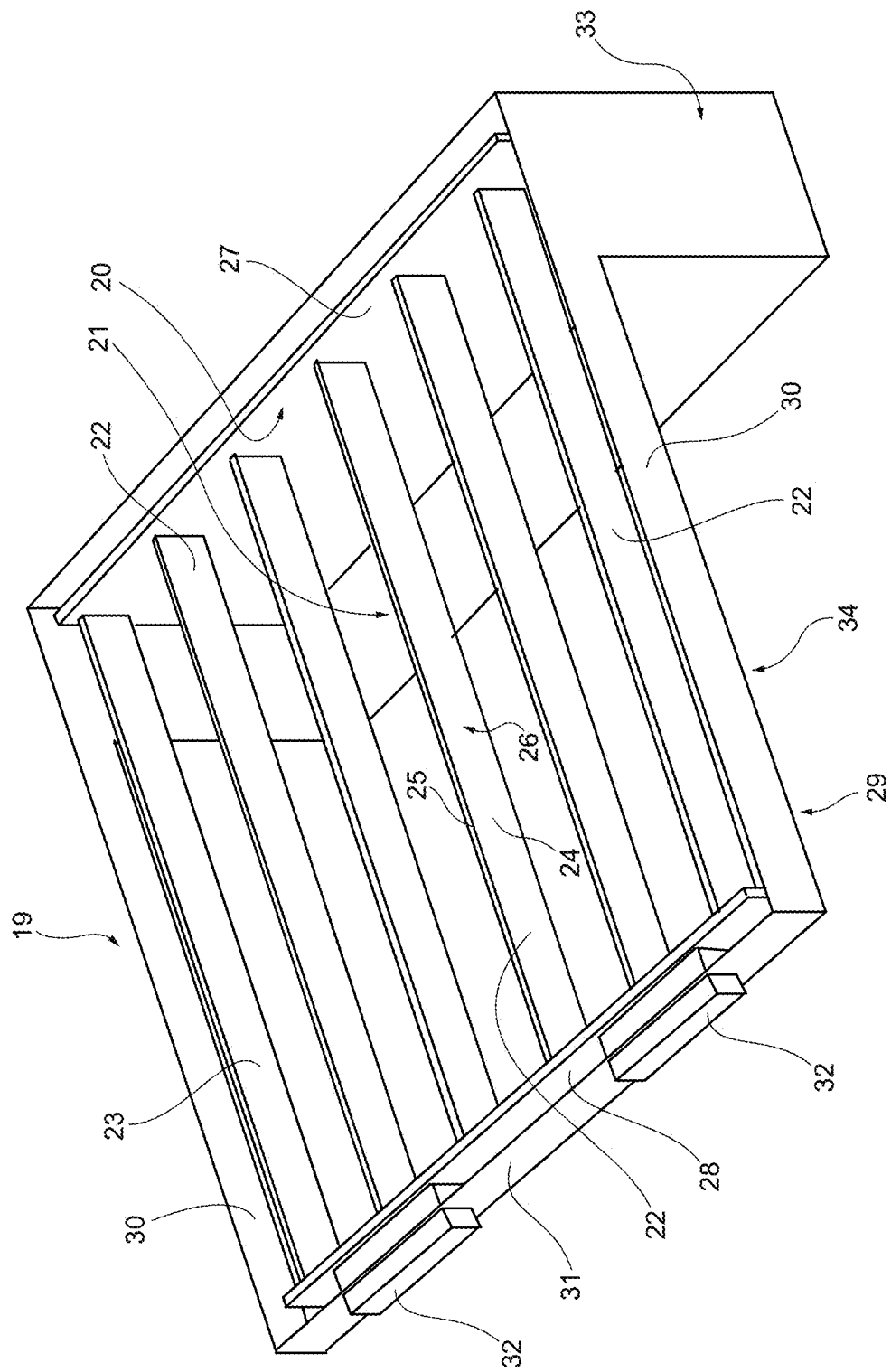
FIG. 2 shows the power supply module of FIG. 1 in the form of a perspective view.

According to FIG. 2, the electric conductors 21 are arranged parallel and at a distance from one another. The electric conductors 21 comprise current conductors that are realized in the form of busbars 22 and at least one signal conductor 23. The busbars 22 have a rectangular cross section with opposing long sides 24 and short sides 25. The long sides 24 of the rectangular cross section essentially extend vertically.

The long sides 24 of the busbars 22 form air baffles 26. These air baffles 26 convey the cooling air current generated by the fans 11 (FIG. 1) vertically between the individual busbars 22 in the direction of the directly adjacent board cage 5 on the rear side (FIG. 1).

The busbars 22 extend from a first printed board 27 that forms part of the electronics unit 20 to a second printed board 28. They are surrounded by a rectangular U-shaped chassis 29. The U-shaped chassis 29 has U-limbs 30 that extend parallel to the busbars 22. The U-shaped chassis 29 also comprises a U-crosspiece 31 that connects the two U-limbs 30 to one another and is arranged transverse to the U-limbs. The U-crosspiece 31 extends parallel to the first backplane 6 (FIG. 1). In the region of the U-crosspiece, the U-shaped chassis 29 is provided with plug-type connectors 32, by means of which a connection between the power supply module 19 and the first backplane 6 (FIG. 1) can be produced.

The power supply module 19 is realized with an L-shaped cross section and has a short L-limb 33 and a long L-limb 34. The electronics unit 20 forms the short L-limb 33 while the busbars 22 form the long L-limb 34.

While exemplary embodiments have been disclosed hereinabove, the present invention is not limited to the disclosed embodiments. Instead, this application is intended to cover any variations, uses, or adaptations of the invention using its general principles. Further, this application is intended to cover such departures from the present disclosure as come within known or customary practice in the art to which this invention pertains and which fall within the limits of the appended claims.

| List of Reference Symbols | |
|---|---|
| 1 | Rack |
| 2 | Front side |
| 3 | Rear side |
| 4 | Board cage on front side |
| 5 | Board cage on rear side |
| 6 | First backplane |
| 7 | Second backplane |
| 8 | Installation space |
| 9 | Lower installation level |
| 10 | First fan module |
| 11 | Fan |
| 12 | Directional arrows |
| 13 | Upper installation level |
| 14 | Second fan module |
| 15 | Directional arrows |
| 16 | Lower end (backplane) |
| 17 | Rear side |
| 18 | Plug-type connector (backplane) |
| 19 | Power supply module |
| 20 | Electronics unit (power supply module) |
| 21 | Electric conductor |
| 22 | Busbar |
| 23 | Signal conductor |
| 24 | Long side |
| 25 | Short side |
| 26 | Air baffle |
| 27 | First printed board |
| 28 | Second printed board |
| 29 | U-shaped chassis |
| 30 | U-limb |
| 31 | U-crosspiece |
| 32 | Plug-type connector |
| 33 | Short L-limb |
| 34 | Long L-limb |

What is claimed is:

1. A rack for accommodating electronic plug-in boards of a computer system, the rack comprising:
front and rear board cages on the front and rear sides of the rack, respectively;
a backplane arranged between the front and rear board cages;
an installation space provided underneath or above the front board cage and into which at least one fan module can be horizontally inserted from the front side of the rack, the installation space continuously extending to a region underneath or above the rear board cage, wherein a first fan module is positionable underneath or above the rear board cage and a second fan module is positionable underneath or above the front board cage;
a power supply module having an electronics unit that supplies power to the backplane, the electronics unit being arranged at the rear side of the rack underneath or above the rear board cage and defining the installation space toward the rear; and
rigid electrical conductors connecting the electronics unit to the backplane, the conductors extending horizontally from the electronics unit to the backplane and being positioned between the rear board cage and a portion of the installation space that receives the first fan module, the rigid electrical conductors being disposed parallel to and at a distance from one another.

2. The rack according to claim 1, wherein the electric conductors comprise busbars having a rectangular cross section, wherein the long sides of the cross section extend vertically.

3. The rack according to claim 2, wherein the long sides of the busbars form air baffles for cooling air.

4. The rack according to claim 2, wherein the power supply module has an L-shaped cross section in which the electronics unit forms the short limb of the L and the busbars form the long limb of the L.

5. The rack according to claim 4, wherein the busbars are surrounded by a rectangular U-shaped chassis in which the U-limbs extend parallel to the busbars and the U-crosspiece is arranged transverse thereto and parallel to the backplane.

6. The rack according to claim 5, wherein the section of the chassis that forms the U-crosspiece carries plug-type connectors for producing the connection with the backplane.

7. The rack according to claim 1, wherein the installation space has upper and lower installation levels that lie on top of one another, wherein the lower installation level can accommodate the first fan module that extends to the region under the rear board cage and the upper installation level can accommodate the second fan module that only extends up to the end of the front board cage.

8. The rack according to claim 7, wherein the backplane protrudes into the installation space with one end and thereby defines the upper installation level toward the rear.

9. The rack according to claim 8, wherein the backplane carries on a rear side thereof plug-type connectors for connecting the power supply module.

10. A power supply module for installation into a rack for accommodating electronic plug-in boards of a computer system, the power supply module comprising:
an electronics unit for generating supply voltages for a backplane disposed in the rack; and
electric conductors that connect the electronics unit to the backplane, the electric conductors comprising busbars having a rectangular cross section with respective opposing long sides and short sides;
wherein, the busbars are arranged parallel to one another and spaced apart from one another along the long sides and the long sides form air baffles for cooling air;
further wherein, the power supply module comprises an L-shaped cross section in which the electronics unit forms the short limb of the L and the busbars form the long limb of the L.

11. The power supply module according to claim 10, wherein the busbars are surrounded by a U-shaped chassis in which the U-limbs extend parallel to the busbars and the U-crosspiece is arranged transverse thereto.

12. The power supply module according to claim 11, wherein the section of the chassis that forms the U-crosspiece carries plug-type connectors for connection with the backplane.

* * * * *